(12) United States Patent
Ferrão De Paiva Martins et al.

(10) Patent No.: US 9,343,609 B2
(45) Date of Patent: May 17, 2016

(54) MESOSCOPIC OPTOELECTRONIC DEVICES COMPRISING ARRAYS OF SEMICONDUCTOR PILLARS DEPOSITED FROM A SUSPENSION AND PRODUCTION METHOD THEREOF

(75) Inventors: Rodrigo Ferrão De Paiva Martins, Charneca da Caparica (PT); Elvira Maria Correia Fortunato, Charneca da Caparica (PT); Pawel Jerzy Wojcik, Devlin (PL)

(73) Assignee: FACULDADE DE CIENCIAS E TECNOLOGIA DA UNIVERSIDADE NOVA DE LISBOA, Caparica (PT)

( * ) Notice: Subject to any disclaimer, the term of this patent is extended or adjusted under 35 U.S.C. 154(b) by 15 days.

(21) Appl. No.: 13/992,660

(22) PCT Filed: Dec. 9, 2010

(86) PCT No.: PCT/PT2010/000057
§ 371 (c)(1),
(2), (4) Date: Sep. 23, 2013

(87) PCT Pub. No.: WO2012/078063
PCT Pub. Date: Jun. 14, 2012

(65) Prior Publication Data
US 2014/0008746 A1 Jan. 9, 2014

(51) Int. Cl.
| | |
|---|---|
| *H01L 51/42* | (2006.01) |
| *B82Y 40/00* | (2011.01) |
| *H01L 51/00* | (2006.01) |
| *H01L 31/18* | (2006.01) |
| *H01G 9/20* | (2006.01) |
| *B82Y 20/00* | (2011.01) |
| *H01L 31/0236* | (2006.01) |

(52) U.S. Cl.
CPC ............. *H01L 31/18* (2013.01); *B82Y 20/00* (2013.01); *B82Y 40/00* (2013.01); *H01G 9/2031* (2013.01); *H01L 31/02366* (2013.01); *H01L 51/0005* (2013.01); *Y02E 10/542* (2013.01); *Y02E 10/549* (2013.01)

(58) Field of Classification Search
CPC ...... B82Y 40/00; B82Y 20/00; H01G 9/2031; H01L 51/0005; H01L 31/02366; H01L 31/18; H01L 31/036; H01L 31/04; H01L 31/0203; H01L 31/048; H01L 51/4246; H01L 51/4213; H01L 51/422; H01L 51/4253; Y02E 10/542; Y02E 10/549; Y02E 10/50
See application file for complete search history.

(56) References Cited

U.S. PATENT DOCUMENTS

| | | | | |
|---|---|---|---|---|
| 6,536,106 | B1 * | 3/2003 | Jackson | B82Y 10/00 204/155 |
| 7,323,634 | B2 | 1/2008 | Speakman | |
| 2004/0060591 | A1 | 4/2004 | Den | |
| 2004/0084080 | A1 * | 5/2004 | Sager et al. | 136/263 |
| 2005/0045874 | A1 * | 3/2005 | Xiao et al. | 257/40 |
| 2005/0183769 | A1 * | 8/2005 | Nakagawa et al. | 136/263 |
| 2007/0065977 | A1 | 3/2007 | Rinzler et al. | |
| 2007/0111368 | A1 * | 5/2007 | Zhang et al. | 438/99 |
| 2007/0167551 | A1 * | 7/2007 | Goodwin et al. | 524/442 |
| 2008/0018725 | A1 * | 1/2008 | Mogi et al. | 347/102 |
| 2008/0092953 | A1 * | 4/2008 | Lee | 136/261 |
| 2008/0092955 | A1 * | 4/2008 | Zhang et al. | 136/263 |
| 2008/0135089 | A1 * | 6/2008 | Tsakalakos et al. | 136/248 |
| 2008/0138530 | A1 * | 6/2008 | Lin et al. | 427/466 |
| 2008/0176030 | A1 * | 7/2008 | Fonash et al. | 428/119 |
| 2009/0188552 | A1 * | 7/2009 | Wang et al. | 136/255 |
| 2010/0055824 | A1 * | 3/2010 | Lin et al. | 438/73 |
| 2010/0078066 | A1 * | 4/2010 | Darling et al. | 136/256 |
| 2010/0139772 | A1 * | 6/2010 | Frank et al. | 136/261 |
| 2010/0147365 | A1 * | 6/2010 | DeSimone et al. | 136/255 |
| 2010/0166954 | A1 * | 7/2010 | Fidanza et al. | 427/245 |
| 2010/0200051 | A1 * | 8/2010 | Triani et al. | 136/255 |
| 2011/0163403 | A1 * | 7/2011 | Bhatia et al. | 257/432 |
| 2011/0192233 | A1 * | 8/2011 | Aizenberg et al. | 73/861 |
| 2013/0244121 | A1 * | 9/2013 | Gogotsi et al. | 429/338 |

Lateral stucture

FOREIGN PATENT DOCUMENTS

| | | |
|---|---|---|
| WO | WO 2008/018936 A2 | 2/2008 |
| WO | WO 2008/129250 A2 | 10/2008 |
| WO | WO 2009/105045 A1 | 8/2009 |

OTHER PUBLICATIONS

Cermak, D.; Hammerschmidt, J.; Rahnfeld, C.; Jahn, S.F.; Blaudeck, T.; Egbe, D.A.M.; Willert, A.; Baumann, R.R. "Digital Fabrication of Functional Nanostructured Layers by Inkjet Printing" Institute for Print and Media Technology, Chemnitz University of Technology, Chemnitz, Germany. 2009.*

Halme, Janne, Jaakko Saarinen, and Peter Lund. "Spray Deposition and Compression of TiO2 Nanoparticle Films for Dye-sensitized Solar Cells on Plastic Substrates." Solar Energy Materials and Solar Cells 90.7-8 (2006): 887-99. Web.*

Gratzel, Dye-sensitized solid-state heterojuction solar cells, MRS Bulletin, vol. 30, 23, (2005).*

International Search Report, mailed Oct. 6, 2011 in connection with PCT International Application No. PCT/PT2010/000057, filed Dec. 9, 2010.

Written Opinion of the International Searching Authority, mailed Oct. 6, 2011 in connection with PCT International Application No. PCT/PT2010/000057, filed Dec. 9, 2010.

* cited by examiner

Primary Examiner — Jarrett Stark
Assistant Examiner — Bitew Dinke
(74) Attorney, Agent, or Firm — John P. White; Cooper & Dunham LLP

(57) ABSTRACT

The invention illustrates an innovative way to fabricate low cost, efficient, rigid or flexible mesoscopic optoelectronic devices such as photovoltaic (PV) solar cells or photo sensors (b) comprising three-dimensional arrays of semi-conductive micro- or nano-pillars (3b) deposited from suspensions e.g. by inkjet printing. Said pillars additionally increase the surface area of the device composed of an interpenetrating network of semiconductor particles of mesoscopic (2-50 nm) size forming junctions. In the present invention the active surface area is significantly increased when compared to previous flat structures (a, 3a), being fabricated preferably by inkjet patterning. Additionally, the invention allows for production of much more functional devices when compared with conventional mesoscopic PV cells due to smaller structure density what makes the layer more resistive to mechanical failure when bending. The invention also describes the device substrate (1), contact and electrode (2, 8), ion conductor (6) and fabrication parameters (h, d).

21 Claims, 6 Drawing Sheets

Layered (planar) structure a b c

MESOSCOPIC OPTOELECTRONIC DEVICES COMPRISING ARRAYS OF SEMICONDUCTOR PILLARS DEPOSITED FROM A SUSPENSION AND PRODUCTION METHOD THEREOF

CROSS-REFERENCE TO RELATED APPLICATIONS

This application is a §371 national stage of PCT International Application No. PCT/PT2010/000057, filed Dec. 9, 2010, the contents of which are hereby incorporated by reference in its entirety.

TECHNICAL FIELD

The present invention concerns a new fabrication process able to enhance efficiency and functionality of mesoscopic optoelectronic devices. The invented method allows fabricating low cost, efficient, rigid or flexible mesoscopic optoelectronic devices such as photovoltaic solar cells or photo sensors comprising of three-dimensional (3D) arrays of semiconductors micro- or nano-pillars deposited from suspensions of inorganic, organic and hybrid materials preferably using inkjet printing.

SUMMARY OF THE INVENTION

The present invention concerns a new fabrication process able to enhance efficiency and functionality of mesoscopic optoelectronic devices. The invented method allows fabricating low cost, efficient, rigid or flexible mesoscopic optoelectronic devices such as photovoltaic solar cells or photo sensors consisting of three-dimensional (3D) arrays of semiconductors micro- or nano-pillars deposited from suspensions of inorganic, organic and hybrid materials using inkjet printing.

The mesoscopic devices of the present invention employ 3D structures which additionally increase the surface area of the device composed of an interpenetrating network of inorganic, organic or hybrid semiconductor particles of mesoscopic (2-50 nm) size forming junctions. This method allows to further increase of already very high contact area of mesoscopic photovoltaic devices instead of the flat morphology used by conventional thin-film technologies, commonly referred as 'bulk' junction devices due to their porous and light structure.

The invention allows for creating 3D arrays of an interpenetrating network of semiconductor micro- or nano-pillars deposited from printable suspensions of inorganic, organic and hybrid materials on substrates, of different origins and compositions, either stiff or flexible, such as paper, metal foils, vitroceramics, mylar or any other type of similar substrates, using inkjet printing technique. Inkjet printing as chemical based deposition method have been already used by inventors to fabricate photovoltaic (PV) devices such as for example dye sensitized $TiO_2$ photodetectors [1], which represents a family of mesoscopic solar cells/photo-sensors.

The innovative fabrication method proposed uses as preferential chemical deposition technique which is inkjet printing that allows simultaneous micro-patterning or submicro-patterning of the proposed micro- or nano-pillars that constitute the active semiconductor of the final device, differently from the objectives of the work published before [1]. The process method proposed is novel and it consists in the deposition of semiconductor dispersion micro-droplets (preferably 1-10 pl) ejected via nozzles to build the successive layers of the 3D structures (pillars). As an example, the set of organic conductive and semiconductor materials includes tetracene, pentacene, Copper Ftalocianine, Titania Ftalocianine and zinc Ftalocianine, while for inorganic conductive and semiconductor materials, binary, ternary or quaternary n-type oxides of Zn, Ti, Nb, Mo, Ta, W, In; Ga; Sn, Al or p-type oxides of Cu, Sn, Ni, Rh, Ag and Ir. These oxides have structures of the type $M_xO_y$; $M_xN_zO_y$; $M_xN_zP_wO_y$; $M_xN_zP_wQ_aO_y$, where M, N, P, Q, represents a metal atom of the ones above listed and x, y, z, w, and a are related to the atomic ratio of the containing in the oxide compound, either in the stoichiometric or the non stoichiometric molar composition whose percentages of each element for a particular composition can vary from 0.001% to 99.999%, where the more or less oxygen contain in the structure as well as the type of cations containing in the structure as host impurities determine the conductive or semiconductive behavior of the clusters deposited and the particles are within the nanoscale size. Apart from that, combinations of organic and inorganic materials (hybrid devices) are also possible. In respect of the present invention the terms suspension, solution, dispersion, emulsion or ink are interchangeable.

The printed micro- or nano-pillars 3D array can be designed to maximize the collecting area and thus the light to energy conversion efficiency by adjusting optimal values of pillar diameter, pillar height and inter-pillar distance, leading to energy efficiency enhancement when compare to flat layer configuration. Additionally, inkjet printed 3D structure makes the device much more functional when compared with conventional mesoscopic PV devices due to smaller structure density what makes the layer more resistive to mechanical failure during bending.

With the present invention we produce micro- or nano-pillars constituted by clusters of nano-sized particles aiming not only to enhance the active area of the devices, allowing to a large enhancement of the light to energy conversion much above to the one concerned the geometrical exposed to the light area. As far as we are aware this innovation has not been developed as far as the state of the art and other patents are concerned.

One of the main innovations claimed in the present invention concerns the method used to enhance the active area in mesoscopic optoelectronic devices as solar cells and photosensors, aiming to artificially increase the active area when compared with the standard flat mesoscopic devices and so the overall energy conversion efficiency from light to energy increase significantly.

For the proposed structures, a simple example of calculation of active surface area in function of pillar height and inter-pillars distance and constant pillar-diameter (see FIGS. 5 and 6) indicate that, compared to flat surfaces, micro- or nano-pillar semiconductor arrays should be more efficient in absorbing light and have a greatly enhanced ability of sensitizer to generate charges and collect them as electrical current. The 3D arrays of micro- or nano-pillars on mesoscopic optoelectronic devices such as solar cell, can increase the surface area by several thousand percent, depending on the size and density of the structures. This suggests that the 3D cell could boost power production by as much as 3,000 percent for vertical microstructured configuration set-up and 4,000 for planar interdigital microstructured configuration set-up compared to conventional solar cells when the structure parameters h and d are in range of 70-200 μm and 500-1000 μm respectively while the pillar diameter is preferably in the range of 1-70 μm, preferably 40-60 μm.

The main flaw that works against the notion of increasing the active surface by 3D array of pillars is their height which leads to resistance loss and overall reduction in the fill factor and photovoltage. The dimensions of the microstructure strongly affect the efficiency of the solar cell. Ohmic losses have to be minimized by a sufficiently-small pillar height or addition of conductive metal oxides nanocrystals or metallic nanoparticles to the ink, whereas the inter-pillars distance should be as large as possible to minimize the shadowing effect. To counter this weakness, an optimal height of semiconductor pillars in the film (within the electron diffusion length dimension and the carriers drift length) is deposited for maximum energy conversion efficiency.

The preferred chemical technique is the inkjet printing, since besides depositing it is possible to directly patterning the structure of the device envisaged turning all process quite simple and cheap. The inkjet printing process consists in the deposition of organic or metal oxide nanoparticles called generally suspension micro-droplets (preferably a few pl) or mixtures of both ejected via nozzles to build the successive layers of the 3D arrays of semiconductor micropillars.

Printable suspension formulation consists of semiconductor nanocrystals and/or nanoparticles dispersed in liquid medium which is a mixture of solvent and additives. Depending on post-treatment temperature the suspension include organic dispersants, binders etc. Suitable ink formulation will result in sedimentation free dispersion which will not dry within the nozzle and will not induce the blocking of the printhead. Mixture of water and isopropyl alcohol are good solvents for semiconductor nanoparticles, because of slow evaporation and environmental benefits. Moreover, for suspensions, the particle size distribution of the nanoparticles must preferably be adjusted to level at least one hundred times smaller than nozzle diameter to avoid the blocking of the printhead. Additionally, the printable fluids must preferably have a viscosity ranging between 1 and 25 cPs (centipoises) and more preferably between 1.5 and 10 cPs while the surface tension should preferably be around 35 dyne/cm, which typically correspond to the specifications given by the printing head supplier.

The present invention is amenable to distinct configurations depending on the specific application that is intended. That is to say, the present invention corresponds to creating a new method to fabricate devices that exhibit a set of innovative functions due to the enhancement of the active area, by means of using, new and innovative processes, afford new. Products and systems involving organic, inorganic or hybrid materials.

In summary:
1. Application of the method which is an object of this invention leads to significant increase in active surface area when compared to a conventional flat structure, whatever the optoelectronic device concerning.
2. Active surface area strongly depends of micro- or nano-patterning array structure (morphology, definition, compacity, etc.).
3. Active collecting light area can be enhanced by more than 40 times when compared to conventional bulk optoelectronic devices allowing so an artificial enhancement of the solar cell performance.
4. For a given final configuration of the micro- or nano-pillar array (diameter and height of pillars, inter-pillars distance, etc.), porous 3D structures can be achieved in an acceptable time by specific combination of ink-jet printing conditions (driving parameters of the printing head, time gap between two successive layers, substrate temperature, etc.) and formulation of the nanoparticle suspension (solid content, addition of surfactant, etc.).
5. The light is repeatedly scattered and enhance the light harvesting efficiency. In contrast to conventional flat solar cells where the sunlight hits a flat surface and can bounce off, so the light only has one chance to be absorbed and turned into electricity, in 3-D PV array the sunlight bounces from pillar to pillar and produces more electricity.
6. The drying time between two successive layers preferably has to be adjusted to eliminate well the solvent. Too short drying time can lead to the coalescence of neighboring droplets and formation of defects such as bridges between pillars. Drying time of each layer can be increased by heating up the printing stage.
7. Conventionally used 'doctor blade' technique for mesoscopic solar cell development gives much lower porosity than it is in case of inkjet printed nanoparticle suspensions layer, where this parameter can be additionally increased by substrate heating during deposition process.
8. The remaining intervening space between the electrodes and the pores in the semiconductor pillars (which acts as a sponge) is filled with an ion conductor. Despite more than the standard distance between the electrodes in the network, electrons can easily get into the circuit.
9. Drop-on-demand inkjet printer is preferred on due to higher resolution and better printing repeatability.
10. The photosensor developed by the invented method can work for a specific wavelength region, in a broad range of wavelengths that goes from 300 nm to 4000 nm, in a wide or window range of wavelengths, dependent on organic or inorganic properties of dye dissolved in solid state polymer electrolyte.
11. In both, planar interdigital microstructured and or nanostructured and planar flat PV configuration, electric tracks (electrodes) are preferably oriented, about a common plane what simplifies the encapsulation process.
12. The 3D micropillar and or nano-pillar structure also means that the cells don't have to be aimed directly at the sun to capture sunlight efficiently. Conventional solar cells work best when the sunlight hits them at a narrow range of angles, but the new 3D system remains efficient regardless of the angle at which the light hits.
13. Because it can capture more power from a given area, the 3D micropatterning could be useful for powering satellites, cell phones, military equipment and other applications that have a limited surface area.

BACKGROUND

The first prototype of the mesoscopic family of optoelectronic devices was the dye-sensitized solar cell (DSC), which accomplishes optical absorption and charge separation by combining a light-absorbing material (the sensitizer) with a wide band gap semiconductor of nanocrystalline morphology. The DSC is used in conjunction with electrolytes, ionic liquids, polymer electrolytes or organic as well as inorganic semiconductors. Other strategies employ blends of organic materials, such as polymeric or molecular semiconductors as well as hybrid cells using a p-type semiconductor polymer in a conjunction with a fullerene or CdSe nanostructures [2]. The mesoscopic morphology of materials used in these PV devices is essential for their efficient operation, suffering by presenting low energy efficiencies, which is limited to the exposed absorber area. This is critical for the most common optoelectronic device able to convert light in energy, as it is the case of solar cells. This approach is not the one of the present invention.

Most solar cells industrially produced are currently based on silicon wafers. As a result, the price of photovoltaic modules is very high and it is still expected to increase due to a fast growing demand and a shortage in silicon production. The cost of the most efficient (30%) tandem solar cells based on III/IV semiconductors is very high, limiting their applications to space and solar concentrators [2]. Single-crystal silicon solar cells with power conversion efficiency of more than 25% are heavy and fragile, which prevents them from being used for mobile applications [3]. However, there is an increasing awareness of the possible advantages of devices based on mesoscopic inorganic and organic semiconductors commonly referred to bulk junction dye to their interconnected 3D structure. Mesoscopic injection solar cells operate in, an entirely different manner from conventional solar p-n junction devices. Mimicking the principles of natural photosynthesis, they separate light harvesting from charge-carrier transport. The semiconductors that conventional cells use assume both functions simultaneously, imposing stringent demands on purity and entailing high material and production costs.

Several concepts have been developed to tackle problems related to conventional solar cell technology. Inorganic thin film devices (based for example on CuInGaSe$_2$) have reached efficiencies above 10.5% ready to enter to a commercial stage [4]. The evolution of dye-sensitized photoelectrochemical cell with inorganic semiconductor has continued progressively since 1991, reaching conversion efficiency of the single-junction cell currently at 12% [2]. Organic solar cells are on the other hand expected to show lower production costs and easier integration on flexible substrates. Yet they still have low efficiencies (around 5% at best) and suffer from short lifetimes as compared to inorganic devices.

Generally, to improve solar cell operation a number of physical processes must be optimized. These phenomena are common to almost all types of solar cells. First of all, when sunlight reaches the solar cell, some of the light is reflected back and lost. A polished Si surface reflects as much as ~37% of light. Special antireflection layer is used to minimize the losses, reducing the reflection to ~18%. In order to reduce the reflection, further, surface texturing is often used, which has shown to reduce the reflection to ~13% [5]. Texturing of monocrystalline silicon is usually done by etching in alkaline solution, since multicrystalline silicon is textured usually by reaction with acid, by reactive ion etching or by mechanical and laser processing [6]. Improvement in performance of textured solar cells is significant. Unfortunately, those methods are first, suitable only for silicon technology; secondly, it's very difficult to incorporate those solutions in production lines.

As far as mesoscopic based solar cells are concerned such as DSC, the active mesoscopic semiconductor layer needs to be thick and porous enough to harvest as many photons as possible. In case of mesoscopic cells, the mesoporous semiconductor film is critical to device performance. A 10 μm thick film increases the total internal surface area by a potential 1000-fold over the geometric smooth surface to maximize light harvesting [2]. Moreover, photo-generation, separation and recombination take place nearly exclusively on the surface of the nanoparticles, and thus the properties of the interface is of critical importance to the conversion efficiency of the device. The mesoporous semiconductor layer enhances the effective surface area for sensitizer molecule attachment for light absorption. In the same time, DSC with varying thicknesses of active layer (for instance, ranging from 3.9 to 12 μm) show qualitatively the same behavior, which shows that the semiconductor layer thickness has no critical influence on peak position [7,8].

And last but not least, the electrons or/and holes created by the absorbed photons must be separated and collected to generate electricity with minimum loss. The Complete equation for the incident photon to current conversion efficiency (IPCE) is the following:

$$IPCE \cong \frac{1240 \times J_{sc}(\lambda)}{\lambda W_i} \times \frac{\eta \times \tau}{t_t} \times 1\text{-}e^{-\alpha d} \qquad (1)$$

where $J_{sc}$ is the short-circuit current density (μA cm$^{-2}$); λ the excitation wavelength (nm); $W_i$ is the photon flux (W m$^{-2}$); η describes the efficiency of the generation charge process (number of electron-hole pairs produced per absorbed photon); $\tau/t_t$ is the ratio between the recombination life time and the free carriers' (electrons) transit time (usually $(\eta \times \tau)/t_t \approx 1$); 1-$e^{-\alpha d}$ represents the photons absorbed by the light sensitive layer, that depends on the product between the absorption coefficient (α) and the layers' thickness (d). For αd>0.4 (high absorption region), the terms between brackets is approximately equal to one, while for αd≤0.4 (weakly absorbed region), the term between brackets is approximately equal to αd, leading to a linear dependence of IPCE on αd. Conducted experiments shows that there is a linear growth of IPCE with thickness (up to around 10 μm) in DSC, in the so-called low absorption regime [7,9]. However, for thicker layers (>10 μm), a very slow decrease of photocurrent is observed because the average path length for the electron diffusion becomes longer and the recombination probability increases. The TiO$_2$ nanocrystals do not have to be electronically doped to render them conducting because the injection of one electron from the sensitizer into a 20 nm sized TiO$_2$ particle suffices to switch the latter from an insulating to a conductive state. This photo-induced conductivity of the particle films allows collecting the electrons without significant ohmic loss [2]. Although some of the physical principles of the present invention aims similar objectives, the method and approached are different from the ones described in the literature.

Nanostructured surfaces like for example nanowires for mesoscopic solar cell applications have been studied by several research groups, and there also been a strong interest to explore these nanostructures for antireflection and light-trapping applications [10,11]. Solar cells comprising nanostructured surfaces as an active element have been also described in U.S. pending patent applications. The U.S. patent application submitted by Zhang et al. (2007/0111368A1, May 2007) describes a photovoltaic structure along with method for forming PV structure with a conductive nanowire array electrode. The nanowires are covered with two semiconductor layers. The first semiconductor layer includes n-type dopant while the second semiconductive layer includes a p-type dopant. The increase in active surface area thanks to the application of conductive nanowire array electrode is based on different principles that those postulated in present invention. The mechanism of light harvesting and manufacturing technology is also quite different from the present innovation.

Recently, Kelzenberg et al. designed a silicon microwire-array structure that improves the efficiency of all main processes in solar cell [12]. Based on silicon CVD-grown microwires, a solar cell which has achieved efficient absorption of sunlight while using only 1% of the active material used in conventional designs has been developed. Results of this work show that microwire arrays are very efficient not only in the absorption of sunlight but also in the collection of charge carriers. This is out of the scope of the present invention, concerning method and final devices (not micropillars but nanowires, a fully different approach).

The U.S. patent application submitted by Korevaar et. al. (2008/0047604A1, February 2008) is directed to photovoltaic devices comprising Si nanowires as active elements in p-i-n type cell. By providing crystalline Si nanowires in an amorphous Si matrix, the path of the holes is dramatically reduced, thereby increasing, hole collection and corresponding device efficiency. This way of efficiency enhancement is different than the mechanism postulated in the present invention.

Attempts to prepare molecular-based solar cells have generally employed molecules in conjunction with semiconducting films (often $TiO_2$) or nanorods (such as CdSe). Conventional molecular-based cells employ several designs. For example, a monolayer of pigment can be deposited on semiconductor surface. A monolayer of pigment can be also bounded to a mesoporous semiconductor layer. In each of these designs, the absorption of light by the pigment can results in electron injection into the semiconductor. However, in practice, conventional molecular-based cellular designs are limited in their efficiency, limitation that it is overcome by the present invention.

A way of smoothly carrying out transfer of electrons and having high photoelectric conversion efficiency but applied in dye-sensitized solar cells have been described in U.S. patent document submitted by Den et al. (U.S. Pat. No. 7,087,831B2, August 2006). The absorption layer-modified semiconductor mixed crystal layer comprises a semiconductor acicular crystal and, a light absorption layer formed on the surface of the crystal. The semiconductor acicular crystal is used as one charge transfer layer and, the light absorption layer is formed between the charge transfer layer (working electrode) and the top charge transfer layer (counter electrode). The method based on the same principles but using different materials and deposition technique have been described in U.S. patent document by Yang et al. (U.S. Pat. No. 7,265,037 B2, September 2007). The main embodiment of these inventions are directed to a method of, deposition ZnO nanocrystals on the substrate using dip coating process and containing the substrate with solution of zinc nitrate hexahydrate and methenamine. Application of acicular semiconductive crystals described in both presented above patents represents a different approach than described in present invention which is more similar to the classical approach postulated by Gratzel [2].

Other methods for nanostructure production and their deposition on the substrate have been described in other U.S. patent documents submitted by Romano et al. (U.S. Pat. No. 7,339,184B2, March 2008; and U.S. Pat. No. 7,344,961B3, March 2008) and Duan et al. (2006/0211183A1, September 2006), which are out of the scope of the present invention. Photovoltaic devices based on nanowire array approach have been also presented in U.S. patent applications by Parsons (2007/0025139A1, February 2007) and Wang et al. (2009/0189145A1, July 2009), whose one of the applications converge to the one of the present patent but the method the structure and compositions are absolutely different.

As a generic comment, the above described devices are essentially based on nanowires and nanorod arrays, some aiming to be used in sensing or photovoltaic applications, fully different of the method and device concept behind the present invention. Both of these proposed device solutions should not be confused with each other as they do not have much in common. The main difference is that the present invention describes a different method of micro- or nano-structures development, completely out of the scope of the previous mentioned devices and processes that represent as far as we know the present state of the art of science and technology.

Performance improvement of all mesoscopic devices is so far the way to increase photocurrent densities using new sensitizer without changing the currently used stable ion conductors. One particular weakness in present mesoscopic solar cells is the presence of a massive number of interfacial boundaries acting as trap sites for electron transport. Another flaw that works against the notion of large metal oxide surface area is the presence of interfaces exposed to the ion conductor. These exposed surfaces, which are not anchored with sensitizer molecules would be in direct contact with ion conductor and provide new recombination pathways as electrons are lost to the redox couple when percolating through the network.

An additional problem in the today's state of the art in the use of mesoscopic devices in many applications is its inconvenient planar structure. The obvious solution to this problem could be application of lateral structure what appears to be only apparently easy [13]. Interdigital electrodes made up of two individually addressable interdigital comb-like electrode structures have frequently been suggested in application of mesoscopic PV devices (Wang et al., U.S. Patent Application Publication, 2009/0188552A1, July 2009). However, its use was limited only to electrical signal collection in large area PV modules, out of the scope of the present invention.

REFERENCES

[1] I. Bernacka-Wojcik, R. Senadeera, P. J. Wojcik, L. B. Silva, G. Doria, P. Baptista, H. Aguas, E. Fortunato, and R. Martins, "Inkjet printed and "doctor blade" $TiO_2$ photodetectors for DNA biosensors", Biosensors & bioelectronics, vol. 25, 2010, pp. 1229-34.

[2] M. Grätzel "Photovoltaic and photoelectrochemical conversion of solar energy", Philosophical transactions. Series A, Mathematical, physical, and engineering sciences, vol. 365, 2007, pp. 993-1005.

[3] M. A. Green, "The Path to 25% Silicon Solar Cell Efficiency: History of Silicon Cell Evolution", Progress in Photovoltaics: Research and Applications, vol. 17, 2009, pp. 183-189.

[4] Z. Zhou, K. Zhao, and F. Huang, "Optical Properties of $Cd_{1-x}Zn_xS$ Thin Films for $CuInGaSe_2$ Solar Cell Application", Materials Research Bulletin, 2010.

[5] S. Chhajed, M. F. Schubert, J. K. Kim, and E. F. Schubert, "Nanostructured multilayer graded-index antireflection coating for Si solar cells with broadband and omnidirectional characteristics", Applied Physics Letters, vol. 93, 2008, p. 251108.

[6] L. A. Dobrzański and A. Drygała, "Surface texturing of multicrystalline silicon solar cells", Journal of Achievements in Materials and Manufacturing Engineering, vol. 31, 2008, pp. 77-82.

[7] M. Kang, K. Ryu, S. Chang, N. Park, J. Hong, and K. Kim, "Dependence of $TiO_2$ Film Thickness on Photocurrent-Voltage Characteristics of Dye-Sensitized Solar Cells", Bulletin of the Korean Chemical Society, vol. 25, 2000, pp. 742-744.

[8] T. Trupke, P. Würfel, and I. Uhlendorf, "Dependence of the Photocurrent Conversion Efficiency of Dye-Sensitized Solar Cells on the Incident Light Intensity", The Journal of Physical Chemistry B, vol. 104, 2000, pp. 11484-1148.

[9] M. Junghänel and H. Tributsch, "Role of nanochemical environments in porous $TiO_2$ in photocurrent efficiency and degradation in dye sensitized solar cells", The journal of physical chemistry. B, vol. 109, 2005, pp. 22876-83.

[10] A. Javey, "A 3D nanostructure for improved solar-cell efficiency", SPIE Newsroom, 2010, pp. 2-4.
[11] M. Law, L. E. Greene, J. C. Johnson, R. Saykally, and P. Yang, "Nanowire dye-sensitized solar cells", Nature materials, vol. 4, 2005, pp. 455-9.
[12] M. D. Kelzenberg, S. W. Boettcher, J. A. Petykiewicz, D. B. Turner-Evans, M. C. Putnam, E. L. Warren, J. M. Spurgeon, R. M. Briggs, N. S. Lewis, and H. A. Atwater, "Enhanced absorption and carrier collection in Si wire arrays for photovoltaic applications", Nature materials, vol. 9, 2010, pp. 239-44.
[13] R. Sastrawan, J. Beier, U. Belledin, S. Hemming, A. Hinsch, R. Kern, C. Vetter, F. M. Petrat, A. Prodi-Schwab, P. Lechner, and W. Hoffmann, "New interdigital design for large area dye solar modules using a lead-free glass frit sealing", Progress in Photovoltaics: Research and Applications, vol. 14, 2006, pp. 697-709.

DISCLOSURE OF THE INVENTION

The present invention concerns a method and device used to enhance the active area of mesoscopic optoelectronic devices such as Solar cells and photosensors using substrates of different mechanical properties, either rigid or flexible, such as glass, PET, PEN, paper, and organic, inorganic and hybrid suspension deposited preferentially via Inkjet Printing Technology.

The main goal of this method is to make possible, to constitute solar cells or photodetectors with efficiencies exceeding the actual practical limits. With this invention it is possible to manufacture devices, either as solar cells or photodetectors, among other optoelectronic devices, to be directly applied to power systems such as wind-screens and automobile windows or visors without need of large implanted areas, which is not possible to achieve with the present devices that take and or require too much space/area when the power required is significantly high due to the limitations imposed by the available areas. In this sense, the present invention corresponds to a huge qualitative jump relative to the current state of the art. The device developed by the invented method is comprised by a (rigid or flexible) substrate\s on top of which, the functionalized semiconducting material is preferably deposited form suspension via inkjet printing in a form of micro- or nano-structured layer.

Figure 5:
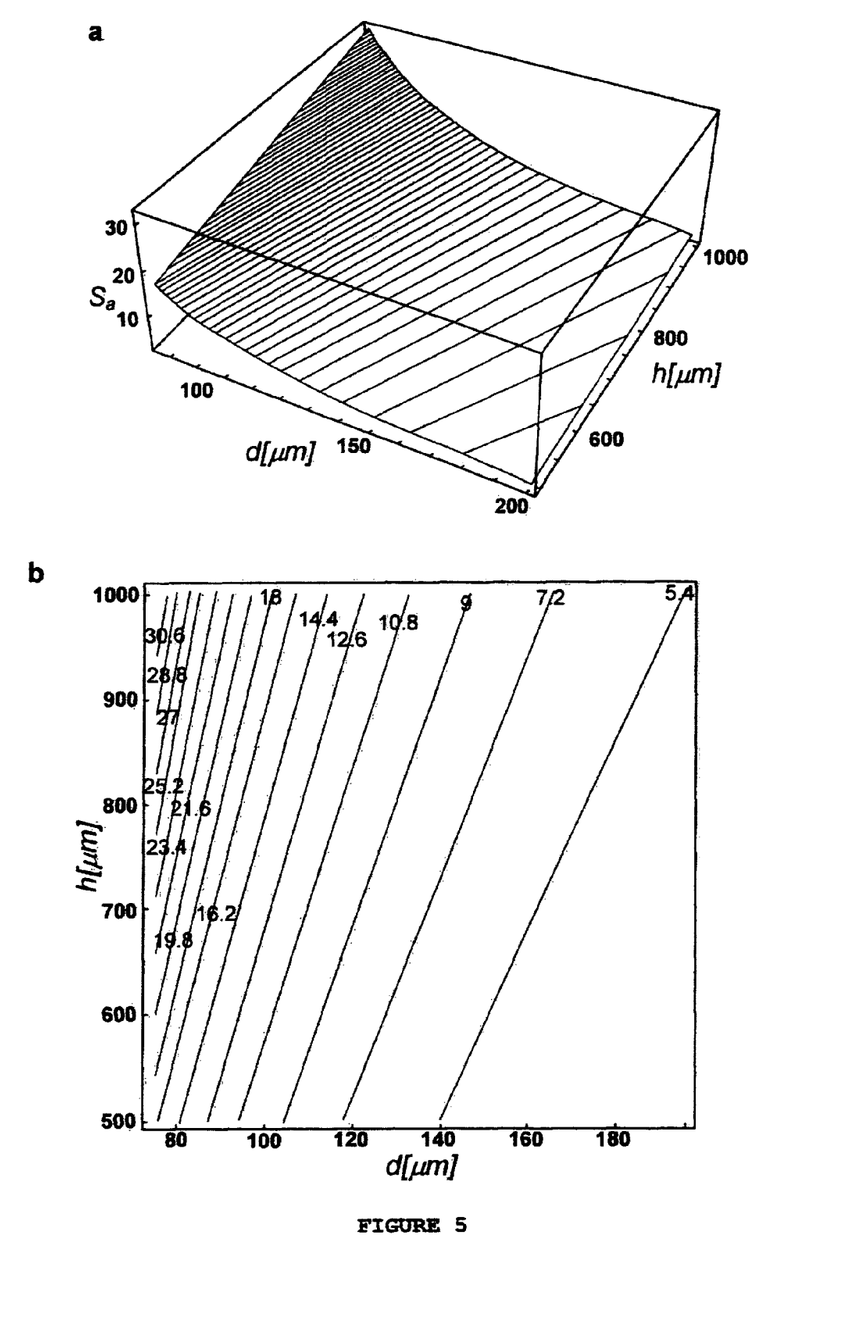
FIG. 5 shows 3D and contour plot which illustrates the example of increase on active surface area as a function of h (pillar height) and d (inter-pillars distance) for vertical micro-structured configuration of mesoscopic solar cell in range of 50-200 µm and 500-1000 µm respectively while the pillar diameter is 50 µm.
Figure 6:
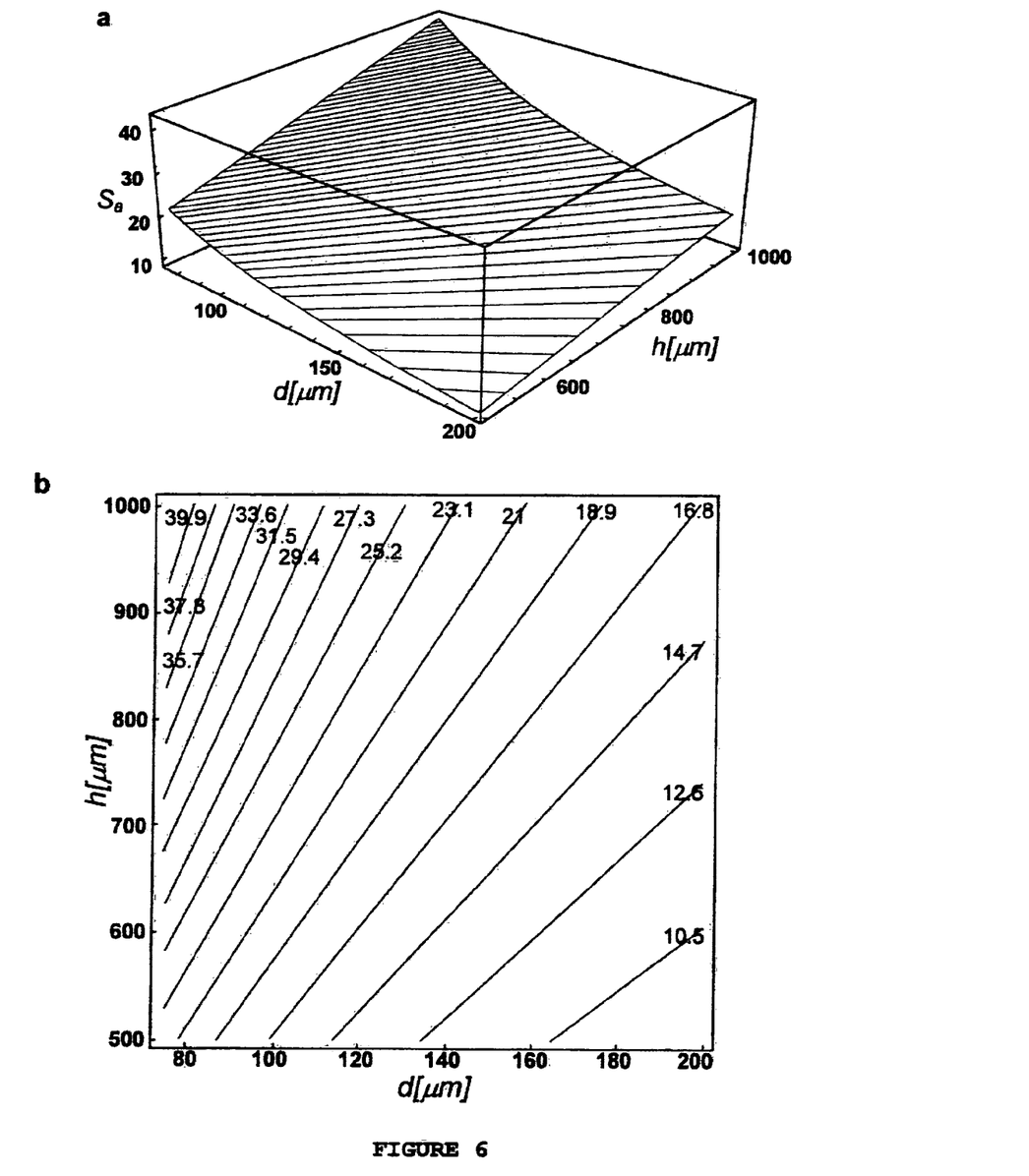
FIG. 6 shows 3D and contour plot which illustrates the example of increase on active surface area as a function of h (pillar height) and d (inter-pillars distance) for planar interdigital microstructured configuration of mesoscopic photo-sensor in range of 50-200 µm and 500-1000 µm respectively while the pillar diameter is 50 µm.

As previously mentioned, the present invention relates to a manufacture method that allows creating an enhanced active area by proper selection and distribution of micro- or nano-pillars of diameter ranging (depends on printhead used) from tens of nanometers to hundreds of micrometers in diameter, typically 40 nm-900 µm, height ranging from tens to thousands of micrometers, typically 20-8000 µm, and inter-pillar distance ranging from tens of nanometers to thousands of micrometers, typically 20 nm-8000 µm, with values selected to maximize the active area once decreasing towards zero the losses by reflectivity, as illustrated in FIGS. 5 and 6.

The diameter of pillars, as most other parameters in the present invention, depends on the size of the nozzle used. Previous nozzles have meant 300-800 micrometers in diameter while most currently available allow for around 20 micrometers, with the best commercially available around 1-5 micrometers. This size is expected to decrease in the future. Research devices may achieve smaller dimensions like 20 nm.

Presently, neither any known patent nor the state of the art comprises the present invention. The search done in several databases of patent records showed that none of the processes, products, and operating systems of the substrate that are the object of the present invention is described in the state of the art.

Although the preferred embodiment has been described in detail, it should be understood that several variations, substitutions, and modifications can be made without departing from the scope of the present invention, even if all the advantages identified above are not present. The embodiments presented herein illustrate the present invention, which can be implemented and incorporated in a variety of different forms that fit in the scope thereof. Also the techniques, constructions, elements, and processes described and illustrated in the preferred embodiment as being distinct or separated can be combined with or integrated into other techniques, constructions, elements, or processes, without departing from the scope of the invention. Although the present invention has been described in various embodiments, these can still be modified according to the application scope of the present invention. Other examples of variations, substitutions, and modifications can be easily determined by those skilled in the art, and could be inserted without departing from the scope of the present invention.

DESCRIPTION OF THE FIGURES

Advantages and features of the invention will become apparent upon reading, the following detailed description and upon reference to the drawings, depicting preferred embodiments which therefore must not be construed as limiting the scope of the invention, in which.

The drawing shows a) transparent substrate coated with transparent conductive oxide layer (TCO) with b) its cross-section; c) semiconductor material layer printed on the substrate and its d) cross-section, deposited as a e) flat layer (the state of the art) or f) micro-structured or nano-structured layer. The encapsulation process consist of a few steps in which the most important are g) application of a rigid spacer shown also in a h) cross-section; i) assembling with a second transparent electrode coated with TCO and counter electrode shown also in a j) corresponding cross-section; k) sealing the structure using a thermoplastic glue shown also in a l) cross-section, leaving a window for a m) injection of ion-conductor which n) is kept inside the volume limited by the spacer; o) closing the interior volume using the same thermoplastic glue which is shown also in a p) cross-section. The last step is optional and consists in r) fitting the metallic contacts on top of both TCO layers shown also in a s) corresponding cross-section.

The main technological steps of device development, are in the drawing showing a process in which a) a dielectric substrate serves as a mechanical support for b) metallic electrodes arranged in form of c) interdigital conductive strips; In first of a two variants d) the semiconducting material is deposited as a flat, layer on one of two interdigital electrodes in which the second electrode is patterned with counter electrode material. In the second variant f) the semiconducting material is formed in a micro-structured or nano-structured columnar form and counter electrode remains unchanged which is shown also in a g) cross-section view and h) enlarged area. Encapsulation consists only on i) drop casting of solid state electrolyte on top of the interdigital structure.

Figures wherein the following references are used:
1—Transparent or/and non-transparent, dielectric substrate (e.g. PEN, PET, Glass, Paper);
2—Transparent conductive oxide (TCO);
3—Semiconductor;
4—Spacer;
5—Thermoplastic glue (sealing around the tape spacer except a hole for injection of ion conductor);
6—Ion conductor (e.g. liquid polymer electrolyte, ion-gel, solid state ion conductor);
7—Electrical contacts (e.g. metal nanoparticles layer);
8—Counter electrode;

It should be emphasized that the drawings in FIGS. 1, 2, 3 and 4 are not to scale but are merely schematic representations and are not intended to portray the specific parameters or the structural details of a conventional mesoscopic solar cells which are well known in the state of the art but just to emphasize inventive method and concepts of the present invention.

DETAILED DESCRIPTION AND EMBODIMENTS OF THE INVENTION

As previously mentioned, the present invention relates to the method and manufacture process of mesoscopic optoelectronic devices such as solar cells and photo-sensors wherein the active area is significantly enhanced resulting in a increasing the energy conversion efficiency of the light to electrical energy preferably using two possible structures: planar or lateral structures based in micro- or nano-pillars deposited form suspension via Inkjet Printing Technology.

The present invention will be further described (see FIGS. 1 to 4) illustrating, the development of mesoscopic optoelectronic devices such as solar cells and photosensors using micro- or nano-patterning via preferentially Inkjet Printing Technology.

The following embodiments help to describe inventive aspects of the invention, not necessarily finished devices, and are therefore able to be combined and partially used as appropriate.

Figure 1:
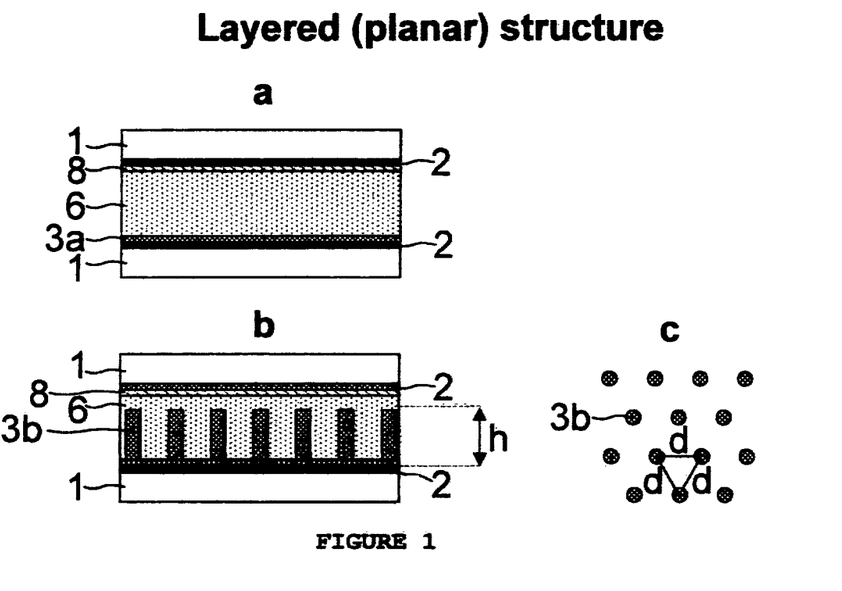
FIG. 1 illustrates the cross-section of a) a vertical flat (the state of the art) and b) a vertical micro-structured PV configuration applied in mesoscopic solar cells; c) arrangement of semiconducting printed columns in a vertical micro-structured or nano-structured configuration (top view) showing distribution of pillars separated each other from a distance d that can vary from tens of nanometers up to thousands of micrometers and the corresponding layout of interdigital electrodes.
Figure 3:
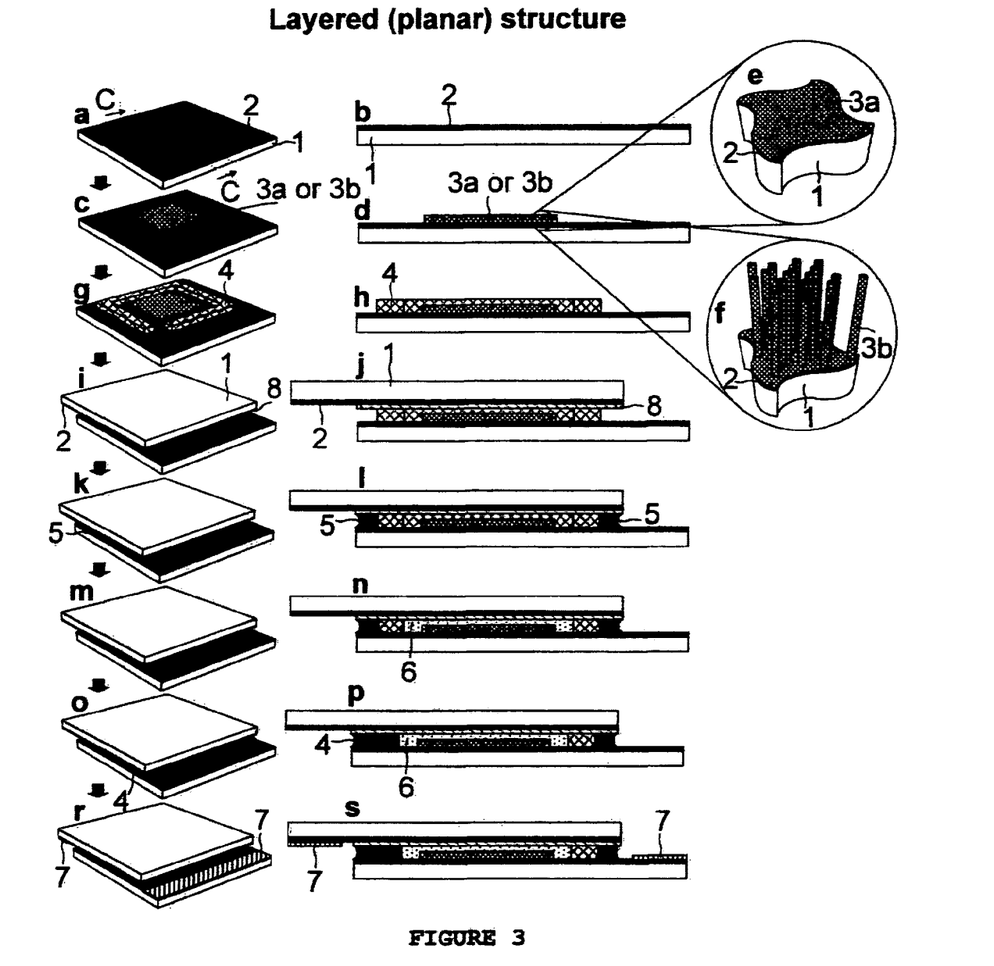
FIG. 3 illustrates a layered (planar) structure of an exemplary embodiment inkjet printed micro- or nano-structured mesoscopic solar cell; the fabrication process; cross-sectional view and magnified elements of mesoscopic solar cell; Presented in this drawing mesoscopic solar cell, includes two planar conducting electrodes arranged in a sandwich configuration.

As depicted in FIGS. 1 and 3, the layered (planar) structure device comprises a transparent or/and non-transparent rigid (e.g. glass) or flexible (e.g. PEN, PET, paper) substrates (1) which are one side coated with transparent conductive oxide (TCO) (2) such as ITO, IZO, GZO, AZO, etc. Two of those coated substrates serving as electrical electrodes make up each single device allowing the collection of electric charges.

Semiconducting layer (3) can be deposited in two variants on the conductive surface of the bottom electrode from suspension via preferentially Inkjet Printing Technique. The first variant which is actually the state of the art [1] assumes that a few micrometer or nanometer thick semiconducting layer is flat (see FIGS. 1a and 3e). In a second variant which is an object of the present invention, the semiconducting material is formed in a micro-structured columnar form (see FIGS. 1b, 1c and 3f), which allows for a significant increase in active surface. Counter electrode material (8) is deposited on the conductive surface of the second (top) electrode using e.g. inkjet printing, spin-coating or any other suitable solution or vacuum processed deposition technique. In case of DSC the semiconductor layer is functionalized using an adequate sensitizer according to the specific recipe which is not an object of the present invention.

The encapsulation process consists of placing a tape spacer (4) around active area of the device (to define the volume for ion conductor) leaving a small hole for electrolyte injection (see FIG. 3g), and assembling both electrodes together in one device (see FIGS. 3i and 3j) followed by sealing the structure abound the tape spacer using preferably thermoplastic glue (see FIGS. 3k and 3l). The next step is to fill the device with ion conductor (6) by injection of its liquid, gel or molten form inside the device (see FIGS. 3m and 3n) followed by closing the remain hole using the same thermoplastic glue (5) (see FIGS. 3o and 3p). The space available between the electrodes (2, 7, 8), available between the electrodes (2, 7, 8) and the pillars (3), and also available in the pores of the pillars. Is preferably filled (6). It is believed that efficiency achieved may also be due to the particularly porous nature of the pillars obtained by the present invention. The last step is optional and consists in fitting the metallic contacts (7) on top of both electrodes as it is shown in FIGS. 3r and 3s.

Figure 2:
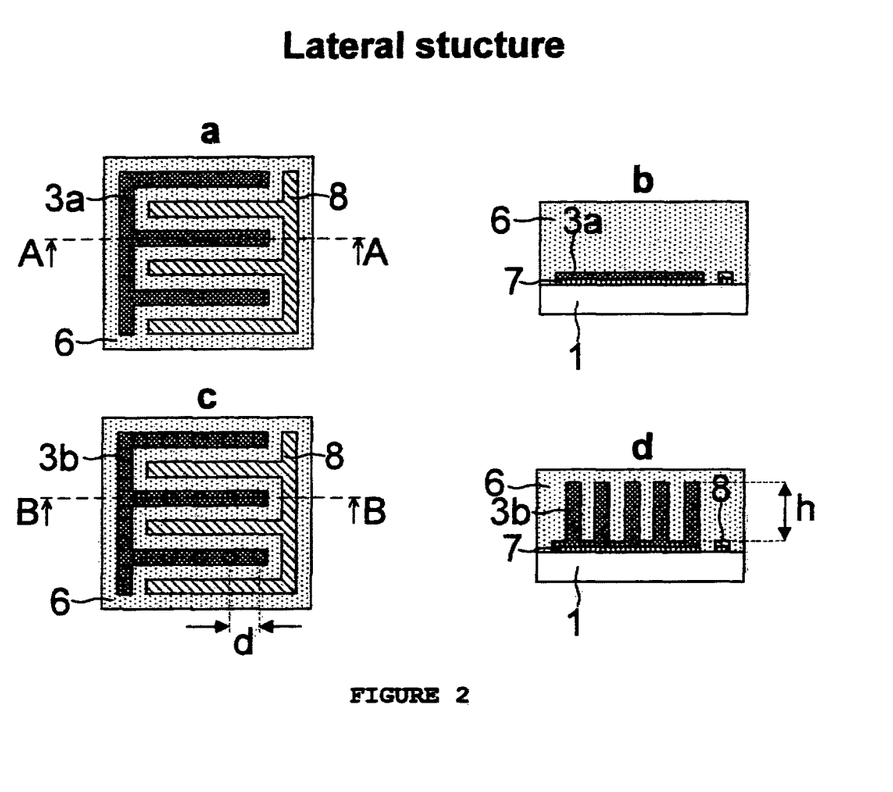
FIG. 2 illustrates the layouts of a) a planar interdigital flat and b) planar interdigital microstructured PV configurations in mesoscopic photosensor and corresponding cross sectional views of the structure.
Figure 4:
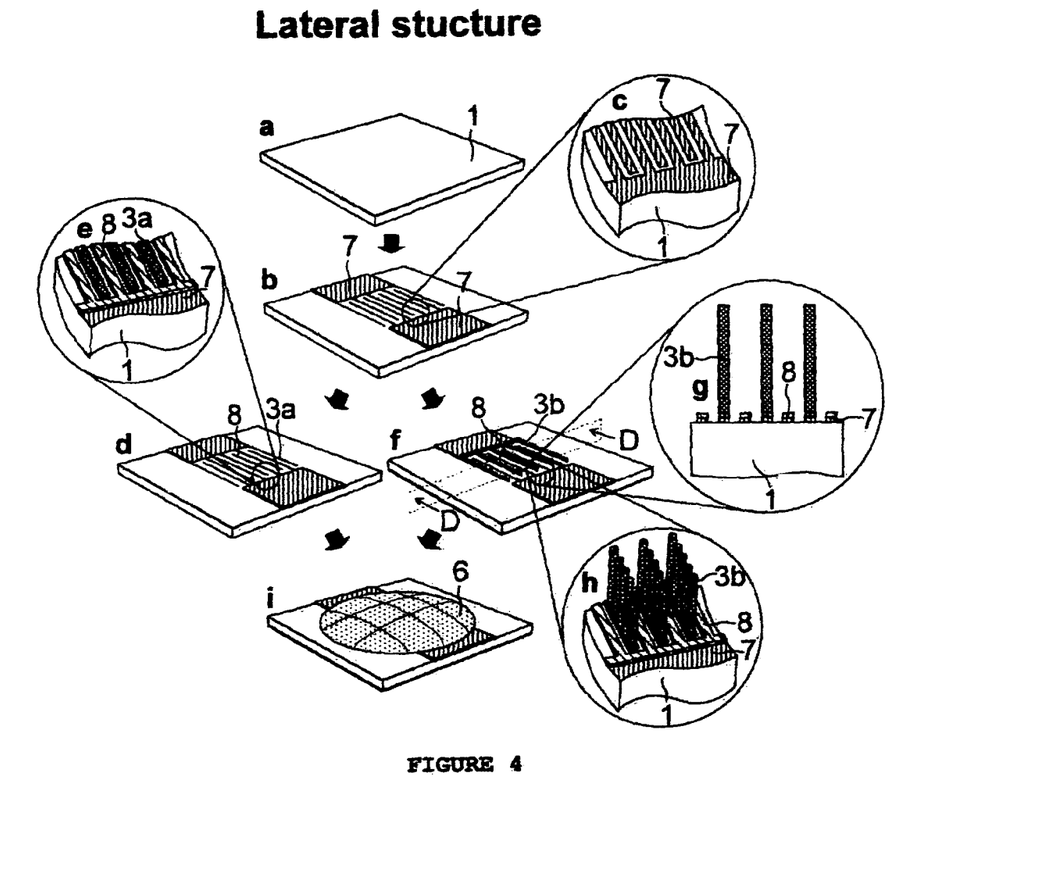
FIG. 4 illustrates a lateral structure of inkjet printing micro- or nano-structured mesoscopic photo-sensor; fabrication process; cross-sectional view and magnified elements of a mesoscopic photosensor.

As depicted in FIGS. 2 and 4, the lateral structure device comprises a transparent or non-transparent rigid (e.g. glass) or flexible (e.g. PEN, PET, paper) dielectric substrate (1). The lateral structure of electrodes base on a series of long inter-penetrating electrode fingers attached to bonding pads at each end to enable electrical contact (7) (see FIGS. 2a, 2c, 4b and 4c). Two of those interdigital electrodes are sufficient to make up each single device allowing the collection, of electric charges in a common plane. Conductive interdigital tracks can be deposited on the dielectric target using e.g. metal nanoparticles or metal oxide nanoparticle suspensions via inkjet printing or via physical vapor deposition techniques (PVD) together with photolithography.

As it was in the previous example, the semiconducting pattern (3) can be deposited in two variants on top of the conductive track via Inkjet Printing Techniques. The first variant assumes that a few micrometer thick semiconducting layer is flat (see FIGS. 2a, 2b, 4d and 4e). In a second variant, the semiconducting material is formed on top of the conductive track in a micro- or nano-structured columnar form (see FIGS. 2c, 2d, 4f, 4g and 4h) which allows for a significant increase in active surface. In case of DSC the semiconductor layer is functionalized using an adequate sensitizer according to the specific recipe which is not an object of present invention. Counter electrode material (2) is deposited in both variants on top of the opposed interdigital electrode preferably using inkjet printing.

The encapsulation process in this case is very simple and consists only on drop-casting the, gel or molten form of solid state electrolyte (6) on top of the interdigital structure as it is shown in a FIGS. 2b, 2d and 4i.

Device embodiments, such as those described above, are preferably based on $TiO_2$ mesoscopic layer printed from suspension (ink) via inkjet printing. The ink formulation can be performed in many ways. Different alternatives are possible to adjust the nanoparticle suspension formulation in terms of nature and content of the different organic compounds (solvent, dispersant, binder, etc.) and of the solid loading to be compatible with, the ink-jet printing process. The particle size distribution of the powder must be adjusted to obtain a ratio of 50 (preferably 100) between the radius of the nozzle aperture and the maximum diameter of the powder to avoid the blocking of the nozzle. Consequently, as the nozzle diameter preferably used is 20 µm, the diameter of metal oxide, namely titania, particles should preferably be smaller than 400 nm (more preferably 200 nm). These sizes are in respect of the working parameters of the nozzle and are to be read together with the preferred nanoparticle size in respect of the actual suspension, which in turn, reflect the preferred nanoparticle size for optimal final device functionality. The ink formulations in details will be further described illustrating the alcohol based and aqueous metal oxide, preferably $TiO_2$, printable, dispersions.

The printable suspension is prepared by dispersing preferably $TiO_2$ anatase nanoparticulate paste (Dyesol, Australia), optimized for transparent titania films which preferably contains nanoparticles of around. 20 µm, also preferably 2-200 nm, more preferably 2-50 nm, in pure ethanol (Aldrich, Germany). A polymeric dispersant, namely EFKA 401 (Efka Chemicals BV, Holland) and a binder, namely PVB (polyvinyl butyral, Wacker Chemie GmbH, Germany) compatible with the solvent is added to the ink. The metal oxide, in particular $TiO_2$, paste content of the ink is preferably between 0.01 and 0.4 w/w and more preferably between 0.02 and 0.05 w/w. The ink contain dispersant preferably between 0.001 and 0.02 w/w and binder preferably between 0 and 0.03 w/w (usually required only for higher solid content, in particular when close to 0.4 w/w).

The printable suspension can also be prepared by dispersing semiconductor nanoparticles, preferably a metal oxide, in particular $TiO_2$ anatase nanoparticulate paste (Dyesol, Australia), optimized for transparent titania films contains nanoparticles of preferably around 20 nm, also preferably 2-200 nm, more preferably 2-50 nm, in namely pure methanol (Aldrich, Germany). The $TiO_2$ paste content is preferably between 0.05 and 0.15 w/w. A Terpineol (Fluka, USA) is added to the dispersion in content range preferably between 0.05 and 0.1 w/w as both, an ink carrier and dispersant. The ink contain also DEHP (Di(2-ethylhexyl) phthalate, Fluka, USA) preferably between 0.01 and 0.05 w/w as plasticizer and ethyl cellulose (Aldrich, Germany) preferably between 0.01 and 0.05 w/w as binder.

The printable suspension can also be prepared by dispersing metal oxide, in particular $TiO_2$ anatase nanoparticulate paste (Dyesol, Australia), optimized for transparent titania films contains nanoparticles of preferably around 20 nm, in mixture of ethanol (Aldrich, Germany) and water (preferably 30:70, range can vary preferably 10:90-50:50). The $TiO_2$ paste content is preferably between 0.1 and 0.4 w/w. The ink preferably does not contain any other additives, because deposition is preferably assisted by heating the substrate up to 120 deg C. Thanks to the elevated substrate temperature, the solvent evaporate in a very short time after droplet deposition. Rapid solvent evaporation of pico-liter droplet limits the ink spreading on substrate surface.

Common steps for all ink formulation preferably concerns stirring, ultrasonic dispersing and filtration, which should preferably be performed every time before the ink is using. The mixture of components or longtime stored ink should preferably be stirred (e.g. magnet) for a few hours in a closed container at room temperature followed by ultrasonic ice cooled bath for 0.5 h. Obtained dispersion must preferably be filtered through a 0.4 µm syringe filter in order to remove agglomerates. As prepared dispersion is stable for many days, however it is preferably recommended to use it directly after preparation due to a possibility of particles agglomeration. Printing is preferably followed by film drying in a room temperature and preferably annealing or frying, in particular around 500° C. for 1 h. The resulting sintered 3D structured layer is usually glassy (transparent for the low structures height).

In order to reduce recombination losses through surface recombination of electrons and holes which is the main factor that decrease efficiency in micro- or nano-pillar structure, the $TiO_2$ electrode material can be replaced by heterostructure nanoparticle film composed of $TiO_2$-ITO, $TiO_2$-FTO, $TiO_2$—$SnO_2$, $TiO_2$—ZnO, $TiO_2$—$Nb_2O_5$ etc. By incorporating those nanoparticles into the $TiO_2$ nanoparticle film, it is achieved that the charge transport properties, or the internal resistance, improve through the use of materials with higher conductivity, resulting in higher short-circuit current density and overall efficiency. This is based on ITO, FTO, $SnO_2$, ZnO, $Nb_2O_5$ etc. having much higher electron mobilities as compared to the electron mobility of anatase $TiO_2$. This improvement has been already published elsewhere. However, results of these studies proved that in case of classical DSC the improvement was not as significant, as it is in case of inkjet printed micro- or nano-pillar structures, existing therefore a synergetic effect with the present invention. Incorporating of ITO, FTO, $SnO_2$, ZnO, $Nb_2O_5$ etc. nanoparticles to the ink in quantity preferably up to 50:50 with $TiO_2$ is possible in any of the embodiments. This is probably due to the particularly porous nature of the pillars obtained by the present invention. This may even also be because conductive particles tend to connect in groups within the layer volume. The distance between those conductive groups is too large so it does not work as best as it could in previous implementations. In the present invention, the pillar volume is limited so the conductive particles can group and form a conductive core in the middle of the pillar.

Correct formation and registration of ink droplets are the keys to deposit material to the desired positions and thus critical to the geometric accuracy of the pillars being fabricated. Ideally, each pulse of firing signal should propel, one ink droplet, which registers on the substrate at a predetermined position. However, the droplet may break up into finer droplets during printing and this phenomenon is termed ink spray. In order to avoid ink sparing, the printhead operating parameters should be adjusted to form single, regular shape droplets. The values of printhead operating parameters depend on the printhead design and should be optimized for a specific printing system, as is easily within the reach of the skilled person in the field.

Applications

The major industries that presently might use the devices and circuits provided by using this innovation are the entire electronics industry, the semiconductor industry, the industry of flat displays and alike, the automotive industry, the paper industry, the advertising industry, the glass industry, the plastic industry, the instrumentation and sensor industry, the food industry, the medical and biotechnological industry, the optoelectronics industry, the micro- and nanoelectronics industry, where energy is required to power the systems directly from the sunlight or where optoelectronic devices such as photosensors are required.

The object of the present invention is to replace the existing mesoscopic optoelectronic devices by using the method of the present invention, which allows producing devices with much large effective areas than the geometrical ones, besides reducing losses by reflectivity within the devices, allowing so a huge enhance of the device efficiency.

The 3D micro- or nano-pillars based photo sensors can be used for detection, identification and quantification of biological matter, being able to produce a monotonic variation of the electrical signal (current or voltage) that is proportional to the concentration of the biological sample, when the correct calibration and correction algorithm are selected.

On the other hand, the required technological manufacture processes are compatible with the ones already existing in the electronics, or optoelectronics, or semiconductor industries, namely the sputtering processes intended for large areas, or thermal evaporation, or sol-gel, or ink-jet, thereby not requiring large investments as far as research and technological adaptations are concerned.

The following claims set out particular embodiments of the invention.

The invention claimed is:

1. An optoelectronic device comprising:
a substrate;
an interdigital structure of electrode fingers formed on the substrate, each electrode finger being longitudinally parallel to the substrate; and
a semiconducting layer formed on the substrate and comprising interdigital tracks, each interdigital track being longitudinally parallel to the substrate and being interlaced with the electrode fingers to form an interlaced planar structure of the electrode fingers and interdigital tracks, the interdigital tracks and electrode fingers being separated by ion conductors,
wherein each of the interdigital tracks of the semiconductor layer has formed thereon a plurality of individual micro- and/or nano-pillars, extending substantially perpendicular to a plane of the interlaced structure, said pillars obtained by deposition of a suspension comprising mesoscopic semiconductor nanoparticles, and
wherein each pillar of the plurality of individual micro- and/or nano-pillars has a diameter and a height and is separated from an adjacent pillar by a non-zero distance.

2. The device according to claim 1, wherein the semiconductor nanoparticles comprise covalent or ionic, amorphous or nanocrystalline particles.

3. The device according to claim 1, wherein the deposition of said suspension is by inkjet printing.

4. The device according to claim 1, wherein said substrate (1) is flexible.

5. The device according to claim 1, further comprising electrodes (2, 7, 8).

6. The device according to claim 1, wherein the suspension comprises semiconductor nanoparticles dispersed in a liquid medium comprising a solvent and a combination of none, one, two or more of the following: surfactant, component for adjusting viscosity, dispersant, binder.

7. The device according to claim 1, wherein the semiconductor nanoparticles comprise:
a. organic materials comprising tetracene, pentacene, Copper Ftalocianine, Titania Ftalocianine and zinc Ftalocianine; and/or
b. inorganic materials comprising binary, ternary or quaternary, n-type oxides of Zn, Ti, Nb, Mo, Ta, W, In, Ga, Sn, Al or p-type oxides of Cu, Sn, Ni, Rh, Ag and Ir, either stoichiometric or non stoichiometric.

8. The device according to claim 1, wherein the suspension comprises dispersed $TiO_2$ anatase nanoparticulate paste 0.01-0.4 w/w, dispersant 0.001-0.02 w/w, binder 0-0.03 w/w, and solvent ethanol.

9. The device according to claim 1, wherein the suspension comprises dispersed $TiO_2$ anatase nanoparticulate paste 0.05-0.15 w/w, dispersant 0.05-0.1 w/w, plasticizer 0.01-0.05 w/w, binder 0.01-0.05 w/w, and solvent methanol.

10. The device according to claim 1, wherein the suspension comprises dispersed $TiO_2$ anatase nanoparticulate paste 0.1-0.4 w/w and as solvent a mixture of ethanol and water in proportion 10:90 to 50:50.

11. The device according to claim 1, wherein the suspension comprises as solvent a mixture of water and isopropyl alcohol.

12. The device according to claim 1, wherein said suspension also comprises one or more additives suitable for reducing the layer transfer resistance.

13. The device according to claim 12, wherein said suspension also comprises up to 0.5 w/w: nanoparticles of conductive metal oxide nanoparticles, metal nanoparticles, ITO, FTO, SnO2, ZnO or Nb2O5.

14. The device according to claim 1, wherein the intervening space, available between the electrodes (2, 7, 8), available between the electrodes (2, 7, 8) and said pillars (3), and also available in the pores of said pillars, comprises a filler (6) which comprises a passive semiconductor; or a solid, gel or liquid state ion conductor; or a polymer electrolyte.

15. The device according to claim 1, wherein the pillars (3) are arranged in arrays wherein the pillar height is 20-8000 µm, the inter-pillar distance is 20 nm-8000 µm, the pillar diameter is 20 nm-900 µm.

16. The device according to claim 15, wherein the pillars (3) are arranged in arrays wherein the pillar height is 50-200 µm, the inter-pillar distance is 500 µm-1000 µm, the pillar diameter is 40 µm-60 µm.

17. The device according to claim 1, further comprising a second substrate (1), a first electrode (2) between the first substrate (1) and the pillars (3), a second electrode (2) between the second substrate (1) and the pillars (3), a counter electrode (8) between the second electrode (2) and the pillars (3), an ion conductor (6) in the intervening spaces between the counter electrode (6) and the pillars (3).

18. The device according to claim 1, further comprising an electrical contact (7) between the substrate (1) and the pillars (3), a counter electrode (8) lateral to the pillars (3) along the substrate (1) direction in a contact-less meshing arrangement with the pillars (3), an ion conductor (6) in the intervening spaces between the counter electrode (6) and the pillars (3).

19. The device according to claim 1, wherein the substrate (1) comprises paper, metal foils, vitroceramics, mylar, glass, PET, or PEN.

20. A photovoltaic solar cell or photo sensor comprising the device according to claim 1, wherein if the photovoltaic solar cell is a dye-sensitized solar cell, the semiconductor layer is functionalized using a sensitizer.

21. A method of producing the optoelectronic device according to claim 1, comprising:

deposition by inkjet of micro-droplets, 1-10 pl, of a suspension, in an array pattern, ejected by nozzles, successively building, layer by layer, in a direction substantially perpendicular to the plane of the interlaced structure, each of the plurality of individual pillars to a specific height;

adjusting the driving parameters of the printing head, the delay between two successive layers, and the substrate temperature in order to prevent the coalescence of neighbouring pillars; and stirring, ultrasonic dispersing and filtrating of the suspension.

\* \* \* \* \*